(12) United States Patent
Sakamoto et al.

(10) Patent No.: US 7,960,747 B2
(45) Date of Patent: Jun. 14, 2011

(54) LIGHT EMITTING DEVICE

(75) Inventors: Hironobu Sakamoto, Tokyo (JP); Dai Aoki, Tokyo (JP); Takahiro Saida, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 132 days.

(21) Appl. No.: 12/020,709

(22) Filed: Jan. 28, 2008

(65) Prior Publication Data

US 2008/0210966 A1 Sep. 4, 2008

(30) Foreign Application Priority Data

Jan. 30, 2007 (JP) ................................. 2007-019595

(51) Int. Cl.
*H01L 33/00* (2010.01)
(52) U.S. Cl. .............................. 257/98; 257/99; 257/100
(58) Field of Classification Search ............ 257/98–101, 257/E33.058, E33.059, E33.06, E33.062, 257/E33.072; 438/22, 25–27, 29
See application file for complete search history.

(56) References Cited

U.S. PATENT DOCUMENTS

| 5,422,232 A * | 6/1995 | Asami et al. .................. 430/533 |
| 2003/0113568 A1 * | 6/2003 | Murschall et al. ............ 428/515 |
| 2005/0167682 A1 | 8/2005 | Fukasawa |
| 2006/0147746 A1 * | 7/2006 | Wakako et al. ............... 428/627 |
| 2006/0186425 A1 * | 8/2006 | Yano et al. ....................... 257/98 |
| 2007/0158669 A1 * | 7/2007 | Lee et al. ......................... 257/98 |

FOREIGN PATENT DOCUMENTS

| JP | 2005-223082 | * | 4/2004 |
| JP | 2004363503 | | 12/2004 |
| JP | 2005-223082 | * | 8/2005 |
| JP | 2005223082 | | 8/2005 |
| JP | 2006294261 A | * | 10/2006 |

OTHER PUBLICATIONS

"Dispersion of Reflection Coefficient and Phase Shift of Antireflecting Multilayer" by Lupashko et al. Journal of Applied Spectroscopy vol. 11, No. 4, pp. 1272-1273, Oct. 1969.*

* cited by examiner

*Primary Examiner* — Wai-Sing Louie
*Assistant Examiner* — Sue Tang
(74) *Attorney, Agent, or Firm* — Kenealy Vaidya LLP

(57) ABSTRACT

A light emitting device is configured to prevent leakage of light but can be reduced in thickness as compared with conventional devices, and can effectively prevent degradation in luminous flux (luminous flux drop). The light emitting device can include a light emitting element, an optically transparent sealing resin having a pair of faces opposed to each other with an axis of light emitting direction of the light emitting device interposed therebetween. The sealing resin can cover the light emitting element and be mixed with a wavelength converting material. A reflective film can be provided on at least one of the pair of opposed faces of the sealing resin. The reflective film can be a white coating containing a white pigment in a concentration of 23 wt % to 54 wt % and formed to be 14 μm to 50 μm in thickness.

20 Claims, 12 Drawing Sheets

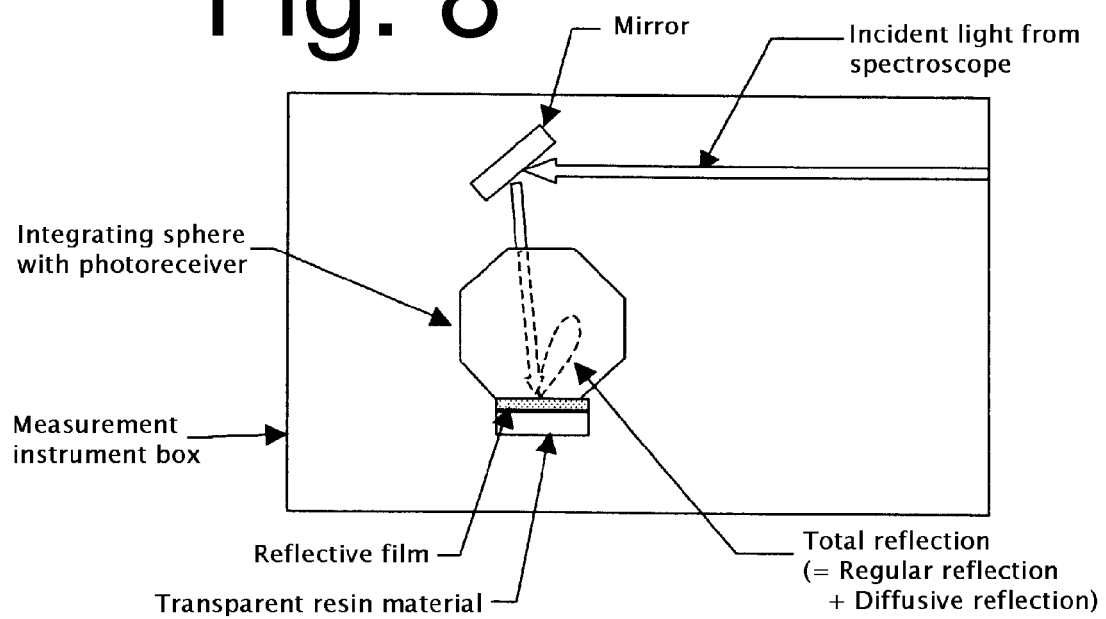
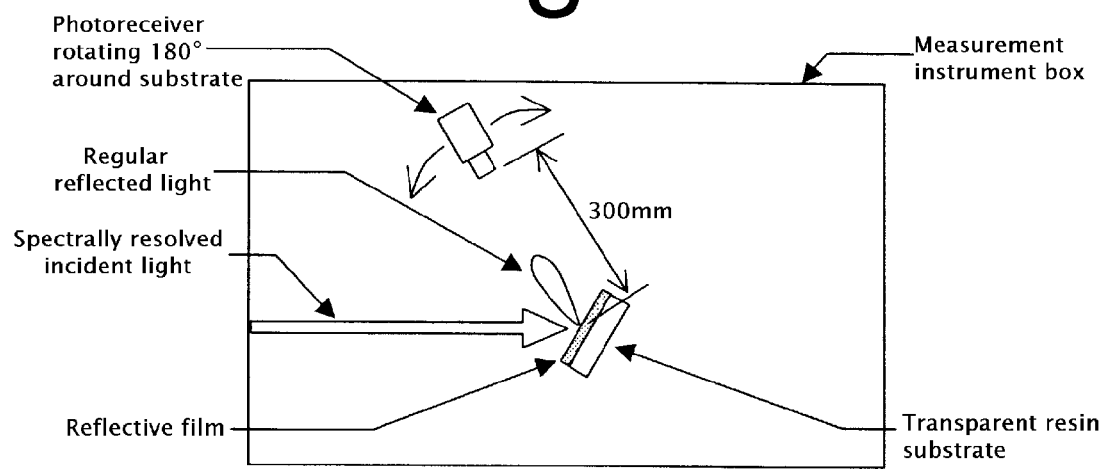

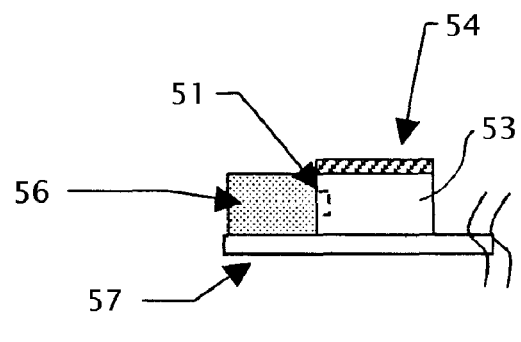
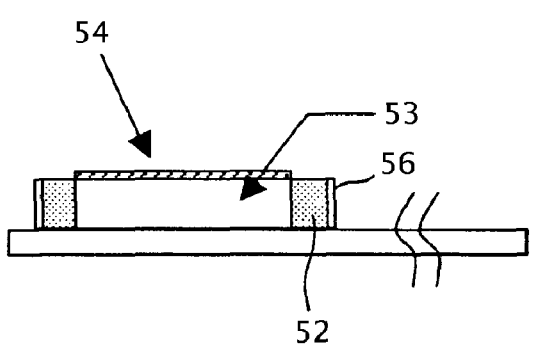
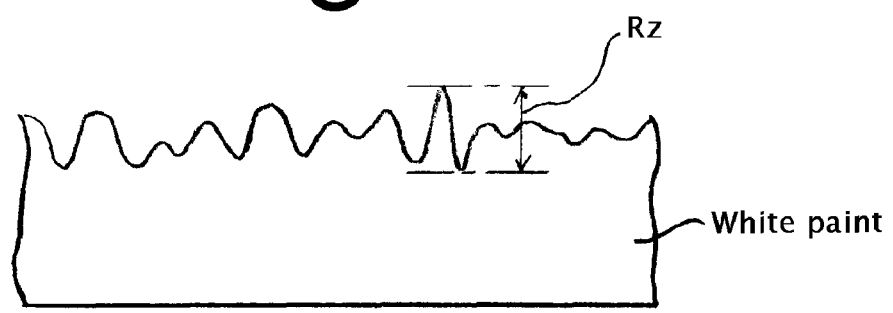

LIGHT EMITTING DEVICE

This application claims the priority benefit under 35 U.S.C. §119 of Japanese Patent Application No. 2007-019595 filed on Jan. 30, 2007, which is hereby incorporated in its entirety by reference.

BACKGROUND

1. Technical Field

The presently disclosed subject matter relates to a light emitting device.

2. Description of the Related Art

As shown in FIG. 1, compact liquid-crystal displays for current cellular phones, digital still cameras (DSC), and other similar devices utilize a backlighting source (backlighting unit). As a light source device for these types of devices, an edge emitting LED or side-view package (hereinafter referred to as the side-view package) is utilized, which emits light mainly in parallel with the surface of a mount substrate. The side-view package is placed in front of the light-receiving face of a light guide plate, so that light emitted from the side-view package can be incident on the light-receiving face and guided through the light guide plate. This configuration constitutes a surface emitting backlighting unit which has little or no unevenness in intensity of light.

FIGS. 2 to 4 illustrate a conventional side-view package (light emitting device).

The side-view package shown in FIG. 2 is configured to include a white substrate cup formed by insert molding or the like, a light emitting element placed in the white substrate cup, and a phosphor-containing resin (sealing resin added with phosphor) injected into the cup to encapsulate the light emitting element and hardened. In this instance, the white substrate serves to reflect the light emitted from the light emitting element. The white substrate is generally formed of a molded resin, and specifically, formed of PPA (polyphthalamide), LCP (liquid crystal polymer), nylon, or the like.

FIG. 3 shows a light emitting device disclosed in Japanese Patent Application Laid-Open No. 2004-363503. In order to prevent leakage of light from the white substrate that is formed as shown in FIG. 2, the light emitting device (or a light source body 1) is configured such that a bottom face portion, a top face portion, and a rear face portion of the white substrate (the light source body 1 formed of a molded resin) are covered with an external reflector 10 (i.e., the external reflector 10 is composed of a bottom face portion 11, a top face portion 12, and a rear face portion 13). It should be noted that the reference alphanumeral 1a denotes a light emitting face in FIG. 3.

FIG. 4 shows a light emitting diode chip disclosed in Japanese Patent Application Laid-Open No. 2005-223082. The light emitting diode chip 21 includes: a chip substrate 22; a light emitter (an LED 24) to be mounted on the substrate 22; an optically transparent resin body 25 for encapsulating the LED 24 on the chip substrate 22; a reflective frame body 26; and a thin metallic reflective film 27. The chip substrate 22 is formed of glass epoxy or BT resin (Bismaleimide Triazine Resin) or the like. The reflective frame body 26 includes reflective faces 26a, 26b, and 26c configured on an interior portion for surrounding three sides of the optically transparent resin body 25. The thin metallic reflective film 27 is formed on top of the optically transparent resin body 25 by vapor deposition, plating, transfer or the like. Thus, a certain directivity of light emitted from the LED 24 is provided for a resin face (being a light emitting face 25a) of the optically transparent resin body 25 that is not surrounded by the reflective frame body 26 and the reflective film 27.

In this instance, the chip substrate 22 is provided with an electrode terminal 23 for electrically communicating with the LED 24 and for being bonded to a mount substrate 29. The LED 24 is a very small square chip which has a pair of element electrode portions (being anode and cathode electrodes). The element electrode portions of the LED 24 are connected to the electrodes on the chip substrate 22 by die bonding or wire bonding.

Further, the optically transparent resin body 25 is formed in a cubic shape by a transparent or milk-white like translucent epoxy or silicon-based resin material being filled therein about the LED 24 on the chip substrate 22. The reflective frame body 26 is formed of a resin molded body or a metal molded body so as to surround the three sides of the optically transparent resin body 25 as shown in FIG. 4 just like an angular U-shape. In this instance, the resin molded body is molded of a resin material which contains a highly reflective member material such as titanium oxide or other metal particles, and the metal molded body has a surface which has a reflective coating.

Recently, the light guide plate of backlights has become thinner as cellular phones and digital still cameras are reduced in thickness. Accordingly, the market demands a thinner side-view package for the light source.

However, the light emitting device shown in FIG. 2 is relatively thick because the sealing resin is surrounded with the white substrate and therefore the white substrate is present in the direction of height of the side-view package.

Furthermore, the light emitting device shown in FIG. 3 can prevent the leakage of light from the white substrate. Nevertheless, the bottom face portion and the top face portion of the white substrate are provided with an external reflector, thereby causing the light emitting device to be increased in thickness.

In addition, the light emitting diode chip shown in FIG. 4 has the thin metallic reflective film formed instead of the white substrate in the direction of height of the side-view package, thereby relatively reducing the thickness of the side-view package to a certain extent. However, the presence of the chip substrate (electrode substrate) below the chip imposes a limitation to a further reduction in thickness.

Furthermore, the light emitting diode chip shown in FIG. 4 employs a metallic reflective film serving as the reflective film 27, thereby causing a decrease in luminous flux (luminous flux drop) as described later.

SUMMARY

In view of the conventional characteristics, features, and problems described above, as well as other characteristics, features, problems, and considerations in the art, the presently disclosed subject matter has been devised. According to an aspect of the presently disclosed subject matter, a light emitting device is configured to prevent leakage of light but can be reduced in thickness as compared with conventional devices, and which can effectively prevent degradation in luminous flux (luminous flux drop) as in the cases described in Japanese Patent Application Laid-Open No. 2005-223082.

In accordance with a first aspect of the presently disclosed subject matter, a light emitting device can include: a light emitting element; an optically transparent sealing resin having a shape including a pair of faces opposed to each other with an axis of light emitting direction of the light emitting device interposed therebetween, the sealing resin being disposed to cover the light emitting element and mixed with a wavelength converting material; and a reflective film provided on at least one of the pair of opposed faces of the sealing resin, wherein the reflective film is a white coating containing a white pigment in a concentration of 23 wt % to 54 wt % and formed to be 14 μm to 50 μm in thickness.

Furthermore, in accordance with a second aspect of the presently disclosed subject matter, a light emitting device can include: a light emitting element; an optically transparent sealing resin having a shape including a pair of faces opposed to each other with an axis of light emitting direction of the light emitting device interposed therebetween, the sealing resin being disposed to cover the light emitting element and mixed with a wavelength converting material; and a reflective film provided on at least one of the pair of opposed faces of the sealing resin, wherein the reflective film is at least one metallic film and 0.6 μm to 15 μm in maximum height Rz.

Furthermore, in accordance with a third aspect of the presently disclosed subject matter, a light emitting device can include: a light emitting element; an optically transparent sealing resin having a shape including a pair of faces opposed to each other with an axis of light emitting direction of the light emitting device interposed therebetween, the sealing resin being disposed to cover the light emitting element and mixed with a wavelength converting material; and a reflective film provided on at least one of the pair of opposed faces of the sealing resin, wherein the reflective film is at least one metallic film and the surface of the sealing resin covered with the reflective film is roughened to have a regular reflection coefficient of 0.5% to 25%.

Furthermore, in the light emitting device in accordance with the second or third aspect of the presently disclosed subject matter, an insulator film can be formed to cover the metallic film.

Furthermore, in the light emitting device in accordance with any of the foregoing aspects of the presently disclosed subject matter, an electrode member can be provided, except for an opening serving as a light emitting face, on part of a side face of the sealing resin or part of a side face of a reflective frame body when the sealing resin is housed in the reflective frame body.

Furthermore, in the light emitting device in accordance with any of the foregoing aspects of the presently disclosed subject matter, the light emitting device can be of a side-view type which mainly emits light from its side face (i.e., which has a main light emitting direction in parallel to a mount substrate of the light emitting device). In this instance, the pair of faces are parallel to the mount substrate.

The light emitting device in accordance with the first aspect of the presently disclosed subject matter can include: a light emitting element; an optically transparent sealing resin having a shape including a pair of faces opposed to each other with an axis of light emitting direction of the light emitting device interposed therebetween, the sealing resin being disposed to cover the light emitting element and mixed with a wavelength converting material; and a reflective film provided on at least one of the pair of opposed faces of the sealing resin, wherein the reflective film is a white coating containing a white pigment in a concentration of 23 wt % to 54 wt % and formed to be 14 μm to 50 μm in thickness. Thus, although the light emitting device is configured to prevent leakage of light, it can be reduced in thickness as compared with conventional devices, and effectively prevent such degradation in luminous flux (luminous flux drop) as in the cases described in Japanese Patent Application Laid-Open No. 2005-223082.

Furthermore, the light emitting device in accordance with the second aspect of the presently disclosed subject matter can include: a light emitting element; an optically transparent sealing resin having a shape including a pair of faces opposed to each other with an axis of light emitting direction of the light emitting device interposed therebetween, the sealing resin being disposed to cover the light emitting element and mixed with a wavelength converting material; and a reflective film provided on at least one of the pair of opposed faces of the sealing resin, wherein the reflective film is at least one metallic film and 0.6 μm to 15 μm in maximum height Rz. Thus, although the light emitting device is configured to prevent leakage of light, it can be reduced in thickness as compared with conventional devices, and effectively prevent such degradation in luminous flux (luminous flux drop) as in the cases described in Japanese Patent Application Laid-Open No. 2005-223082.

Furthermore, the light emitting device in accordance with the third aspect of the presently disclosed subject matter can include: a light emitting element; an optically transparent sealing resin having a shape including a pair of faces opposed to each other with an axis of light emitting direction of the light emitting device interposed therebetween, the sealing resin being disposed to cover the light emitting element and mixed with a wavelength converting material; and a reflective film provided on at least one of the pair of opposed faces of the sealing resin, wherein the reflective film is at least one metallic film and the surface of the sealing resin covered with the reflective film is roughened to have a regular reflection coefficient of 0.5% to 25%. Thus, although the light emitting device is configured to prevent leakage of light, it can be reduced in thickness as compared with conventional devices, and effectively prevent such degradation in luminous flux (luminous flux drop) as in the cases described in Japanese Patent Application Laid-Open No. 2005-223082.

BRIEF DESCRIPTION OF THE DRAWINGS

These and other characteristics, features, and advantages of the presently disclosed subject matter will become clear from the following description with reference to the accompanying drawings, wherein:

FIG. 8 is an explanatory view illustrating measurement of total reflection;

FIG. 9 is an explanatory view illustrating measurement of total reflection;

Figure 11A:
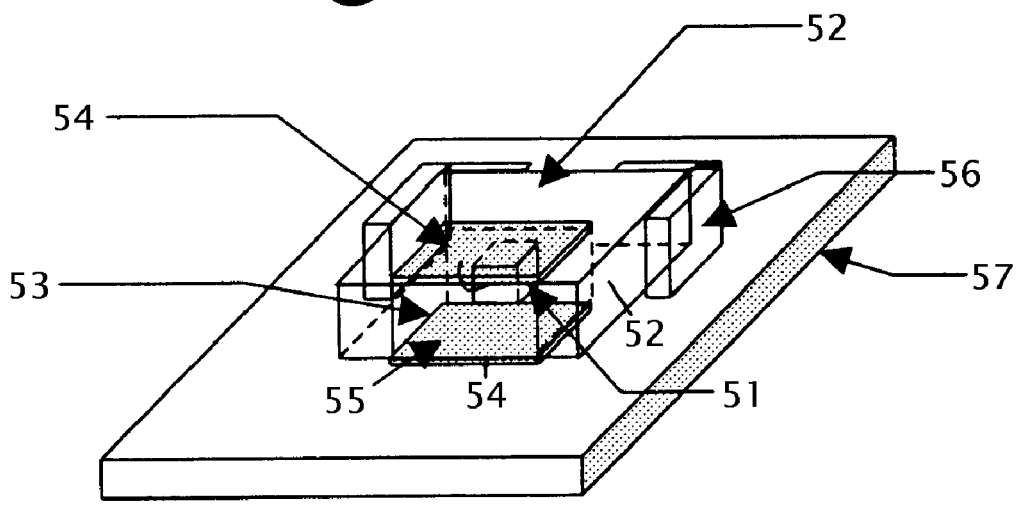
FIGS. 11A through 11C are views illustrating an exemplary configuration of a light emitting device made in accordance with principles of the disclosed subject matter, FIG.
Figure 11B:
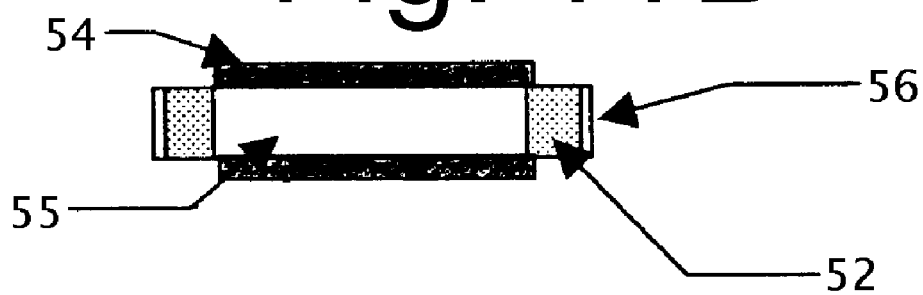
Figure 11C:
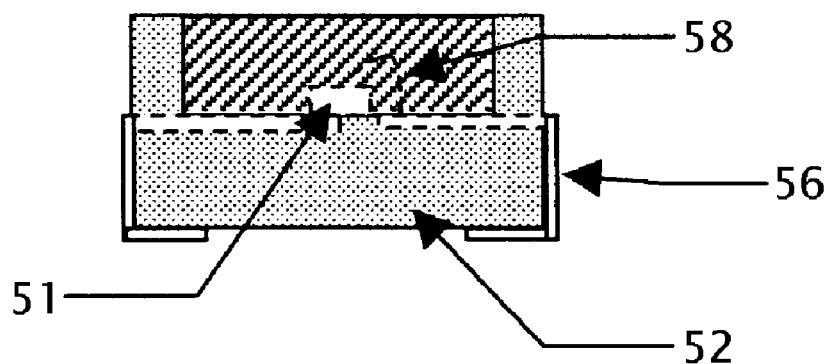
Figure 12:
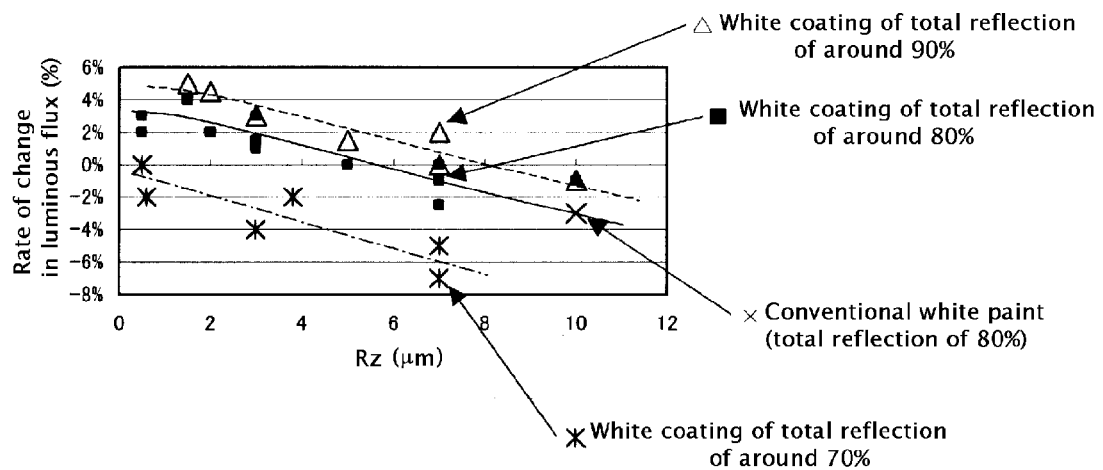
Figure 13:
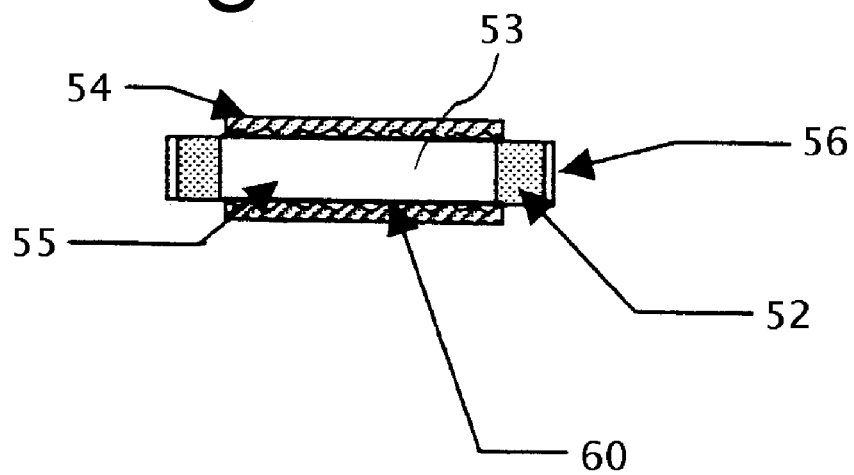
Figure 14:
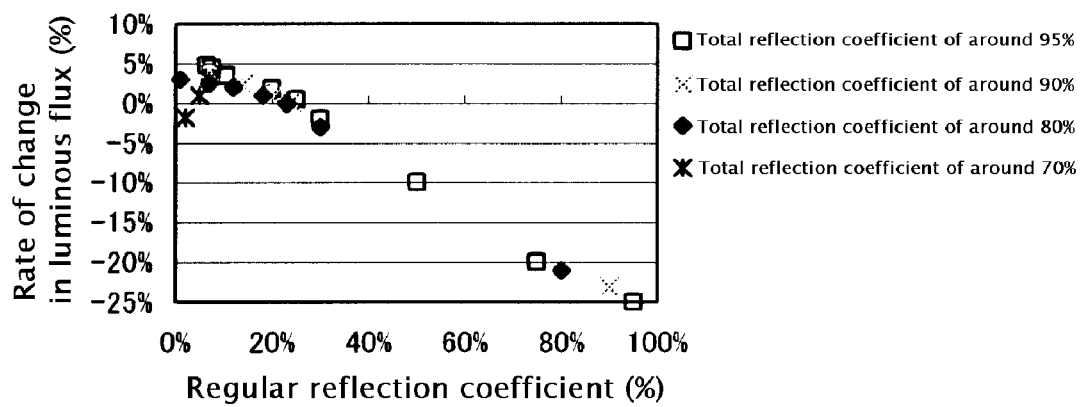
Figure 15:
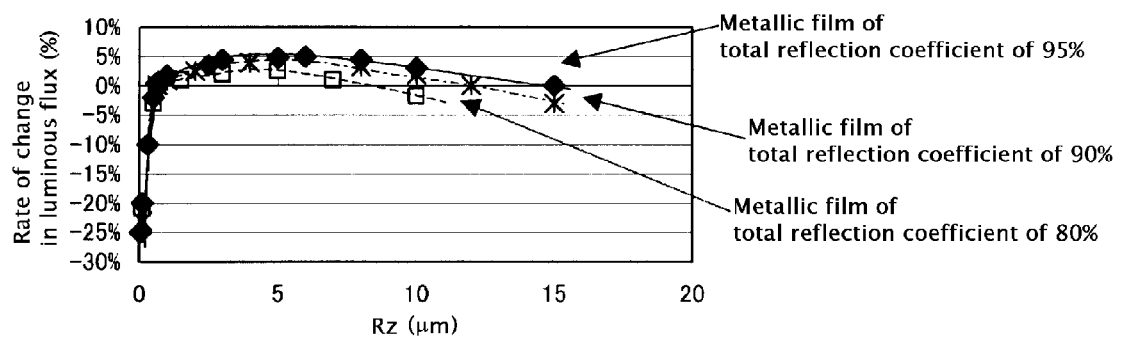
Figure 16:
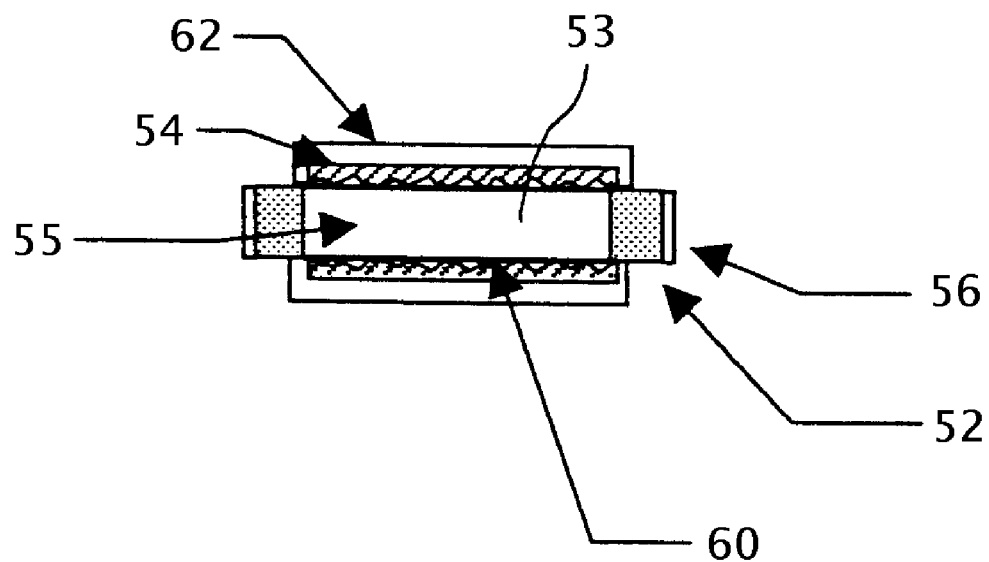
Figure 17:
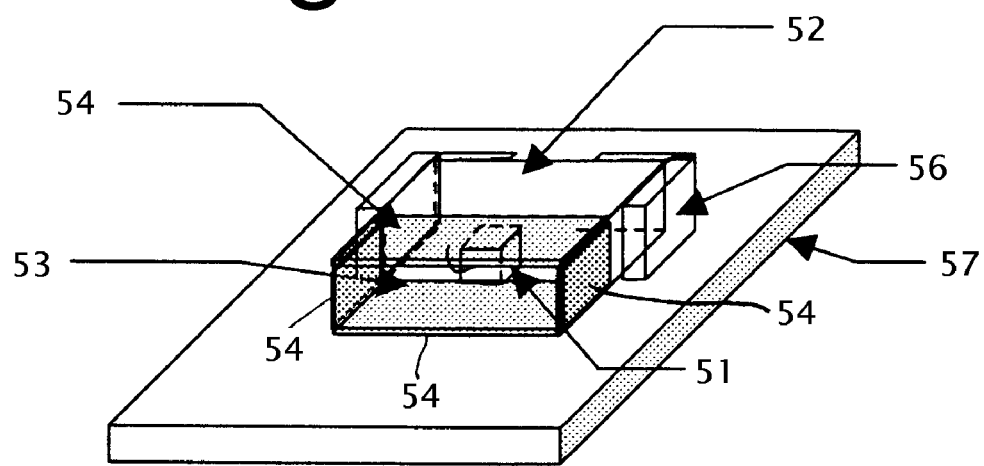
Figure 18:
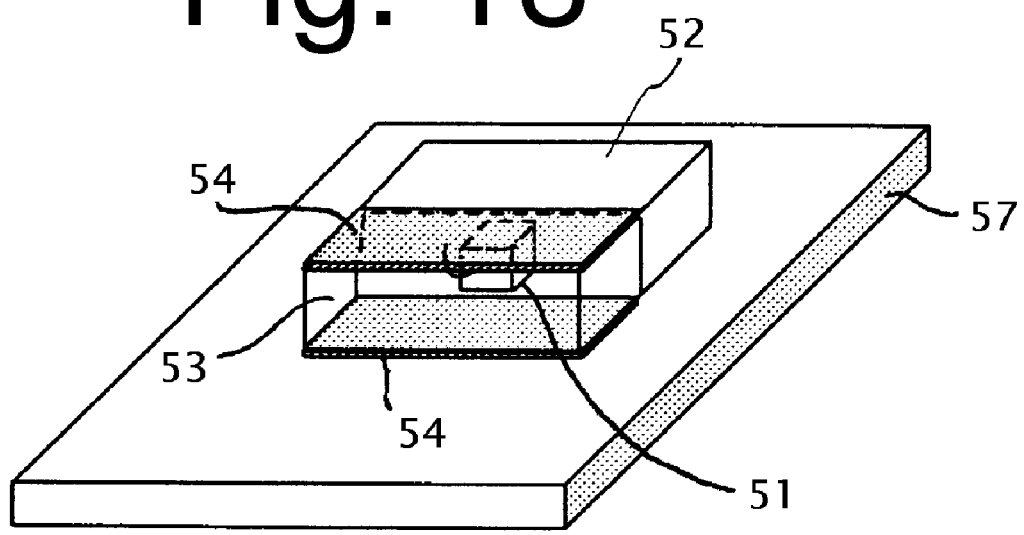
Figure 19:
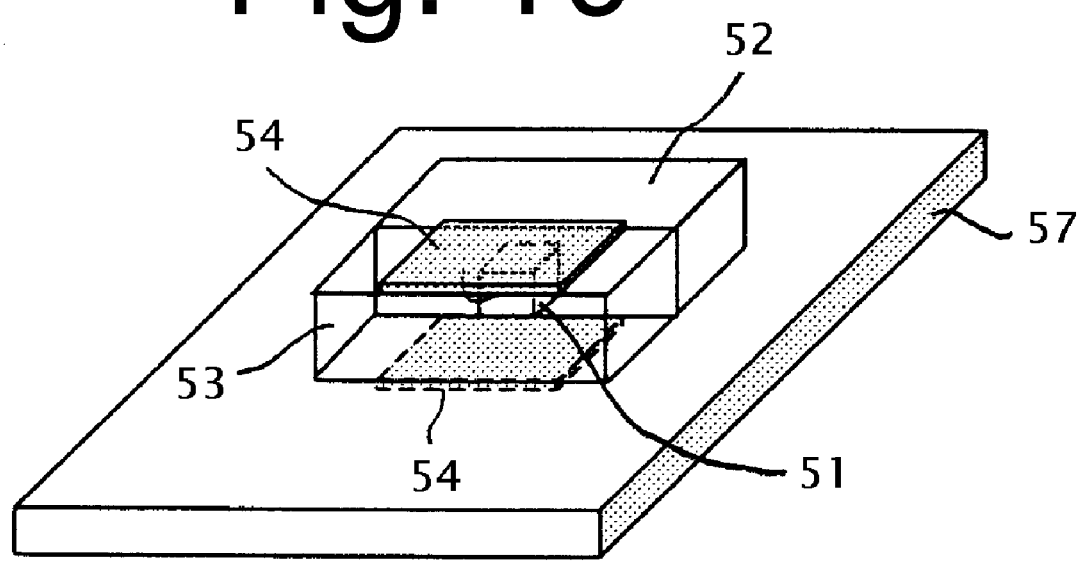

11A being a perspective view, FIG. 11B being a front view, and FIG. 11C being a top view;

FIG. 12 is a graph illustrating the relationship between the surface roughness (Rz) and the rate of change in luminous flux;

FIG. 13 is a front view illustrating a specific example of a second exemplary embodiment of a light emitting device made in accordance with principles of the disclosed subject matter;

FIG. 14 is a graph illustrating the relationship between the regular reflection coefficient and the rate of change in luminous flux of a metallic film;

FIG. 15 is a graph showing the surface roughness and the rate of change in luminous flux of the metallic film;

FIG. 16 is a front view illustrating the construction of an insulator film which is provided on top of the metallic film or over the entire metallic film to prevent faulty electrical continuity;

FIG. 17 is a perspective view illustrating an example in which a reflective film is provided on the top face, the bottom face, the right side face, and the left side face of the sealing resin mixed with a wavelength converting material (e.g., phosphor);

FIG. 18 is a perspective view illustrating another exemplary configuration of a sealing resin for expanding light emitted from a light emitting element in a direction of a side face thereof;

FIG. 19 is a perspective view illustrating another exemplary configuration of a sealing resin for expanding the light emitted therefrom in all directions;

FIGS. 20A and 20B are views illustrating an exemplary configuration with a reflective film on the mount substrate eliminated; and FIG. 21 is a graph illustrating the maximum height (or surface roughness) Rz.

DETAILED DESCRIPTION OF EXEMPLARY EMBODIMENTS

Now, the presently disclosed subject matter will be described in more detail with reference to the accompanying drawings in accordance with the exemplary embodiments.

In the present description, the mount substrate of a side-view package serves to be a horizontal plane as a reference plane, and the surfaces of the package are defined with respect to this horizontal plane, including an upper surface, a bottom surface, and the like.

Figure 5:
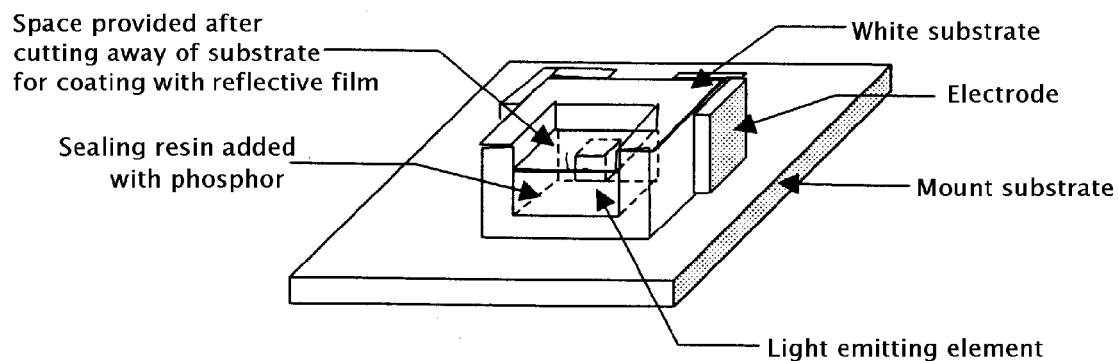
FIG. 5 is a perspective view illustrating a conventional side-view package with the top face of its white substrate cut away.

FIG. 5 illustrates a conventional side-view package with a thickness of 0.6 mm, with the top face of its white substrate cut away. It should be appreciated that a blue LED can be used as the light emitting element and a yellow phosphor contained in the sealing resin as a wavelength converting material. The inventor of the present application attached various types of reflective films to the portion from which the white substrate was cut away from part of the top face portion as shown in FIG. 5, and measured luminous flux and chromaticity for luminous flux comparison between the various reflective films. Luminous flux comparisons were made using the rate of change in luminous flux which was calculated based on the luminous flux value obtained before the substrate was cut away. The package used was a conventional side-view package 0.6 mm in thickness. This package was employed as a reference for comparison to the package with the white substrate cut away, with white paint reflective film (white coating) formed thereon, with Ag thin reflective film formed thereon, and with reflective film of silver paint formed thereon.

The various reflective films were formed in a space provided on an upper side for coating with reflective film (in FIG. 5, a space provided after the substrate was cut away for coating with reflective film). The white paint and the silver paint were applied using a dispenser. The thin Ag film was deposited by sputtering.

Figure 6:
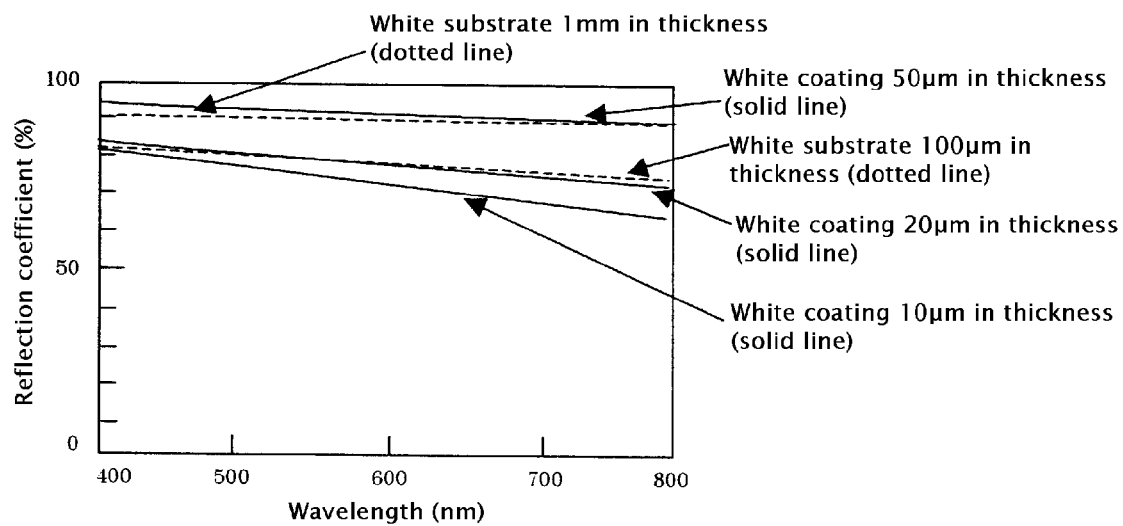
FIG. 6 is a graph showing the reflection coefficient of a white coating containing $TiO_2$ in a concentration of 40 wt % in the white coating in terms of its thickness.

The white paint reflective film (white coating) can be a mixture of a $TiO_2$ white pigment and a transparent resin (i.e., a resin which contains one or more of silicone-based, acryl-based, urethane-based, and epoxy-based resins). FIG. 6 shows the reflection coefficient of the white coating in terms of its thickness when the white coating contains $TiO_2$ in a concentration of 40 wt %. The aforementioned comparisons were made using a white coating of 20 μm thickness in FIG. 6 which has generally the same reflection coefficient as that of the conventional white substrate.

Furthermore, the silver paint can be a mixture of an Al flake and a transparent resin (i.e., a resin which contains one or more of silicone-based, acryl-based, urethane-based, and epoxy-based resins). The aforementioned comparisons were made using a silver paint of a reflection coefficient of 61%, which was obtained by optimizing the reflection coefficient in conjunction with its concentration and thickness. A thin Ag film of purity 99.999% was deposited by sputtering. Table 1 below shows the performance comparison between each reflective film of the side-view packages.

TABLE 1

| Type of reflective film | Thickness (μm) | Total reflection coefficient | Rate of change in luminous flux (%) | Chromaticity |
|---|---|---|---|---|
| Conventional white substrate | 100 | 80% | 0% | (0.29, 0.28) |
| After cutting | 0 | 5% | −20% | (0.275, 0.255) |
| White paint | 20 | 80% | −3% | (0.29, 0.28) |
| Ag for sputtering | 0.1 | 95% | −25% | (0.27, 0.24) |
| Silver paint | 20 | 61% | −40% | (0.26, 0.23) |

(Notes)
The white paint has a surface accuracy (Rz) of 10 μm, a regular reflection coefficient of 0%, and a diffusive reflection coefficient of 80%.

Figure 7:
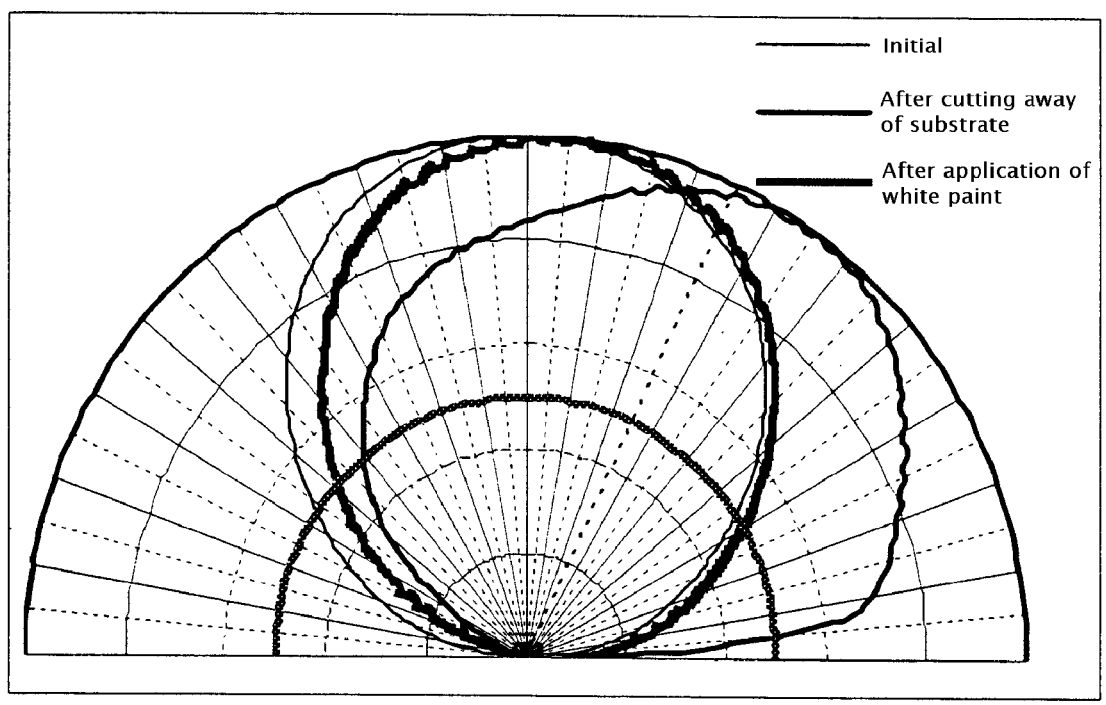
FIG. 7 is a view illustrating the directivity of light before and after application of white paint and after the white substrate has been cut away.

The performance with the white substrate cut away shows that the luminous flux was reduced by 20%, and the chromaticity was shifted toward the blue spectrum when compared with that of the device with the white substrate provided (before it was cut away). This is because the absence of a reflective material resulted in a reduction in the yellow component of light which would otherwise be produced by excitation of phosphor. That is, it was found that the lack of reflective material would cause a reduction in luminous flux due to inefficient excitation of phosphor. FIG. 7 shows the directivity of light before and after the application of the white paint and after the white substrate was cut away. The directivity in FIG. 7 also shows that light from the white substrate with no reflective material and with the white substrate cut away was spread out, resulting in the directivity being degraded.

It was also found that the thin Ag film serving as the metallic film was reduced in luminous flux by 25%, and the chromaticity was shifted toward blue when compared with the conventional white substrate device, thereby causing a significant drop in performance as compared with the conventional device. It was also found that even a highly reflective metallic film would cause a reduction in luminous flux when the sealing resin had a mirror-finished surface or a nearly mirror-finished surface. This also holds true for Al having a reflection coefficient of 85%.

Furthermore, the silver paint, which has a constant reflection coefficient in the visible light region and reflects blue and yellow light, was reduced in the rate of change of luminous flux by 40% because the reflection coefficient was as low as 61%. This is because the absorption by the silver paint prevents the excitation of phosphor, and thus the chromaticity is shifted toward blue.

This shows that the thin Ag reflective film or the reflective film of silver paint is not always suitable for the side-view package.

When compared with the aforementioned two reflective films, the white paint device operated at the same level as the conventional white substrate in terms of luminous flux and chromaticity. This is because, like the white substrate, the white paint provides diffusive reflection rather than regular reflection and thus causes the occurrence of excitation of phosphor with efficiency. The directivity obtained was also generally at the same level as that provided by the white substrate device alone, as shown in FIG. 7.

Furthermore, the inventor of the present application measured the luminous flux of the side-view package, which has resin added with phosphor, using the total reflection coefficient, the regular reflection coefficient, and the diffusive reflection coefficient of the reflective film as a parameter. The results are shown below in Table 2.

TABLE 2

| Type of reflective film | Surface roughness Rz (μm) | Total reflection coefficient | Regular reflection coefficient | Diffusive reflection coefficient | Rate of change in luminous flux |
|---|---|---|---|---|---|
| Conventional white substrate | 1.1 | 80% | 2% | 78% | 0% |
| White paint | 0.5 | 80% | 5% | 75% | 3% |
| | 2 | 81% | 3% | 78% | 2% |
| | 3 | 80% | 2% | 78% | 1.5% |
| | 5 | 80% | 1% | 79% | 0% |
| | 7 | 81% | 0% | 81% | −1% |
| Ag for sputtering | 0.05 | 95% | 95% | 0% | −25% |
| | 0.1 | 95% | 75% | 20% | −20% |
| | 0.3 | 95% | 50% | 45% | −10% |
| | 0.5 | 95% | 30% | 65% | −2% |
| | 0.6 | 95% | 25% | 70% | 0.5% |
| | 1 | 95% | 20% | 75% | 1.8% |
| | 2.5 | 95% | 10.5% | 85% | 3.5% |
| Silver paint | 4 | 61% | 0% | 61% | −40% |

The luminous flux comparison was made using the rate of change in luminous flux which was computed based on the luminous flux value obtained before the white substrate was cut away.

Each reflection coefficient is defined as follows. The measurement was carried out using a spectroscope at a measurement wavelength of 560 nm. The total reflection coefficient was obtained by acquiring both the regular reflection and the diffusive reflection using an integrating sphere (see FIG. 8). The regular reflection coefficient was obtained by measuring the maximum regular reflection coefficient of the reflected light that is incident at an angle of incidence of 30 degrees upon a photoreceiver which was rotated 180 degrees around the substrate at a distance of 300 mm away from the substrate (see FIG. 9). The diffusive reflection coefficient was simply calculated from the measured total reflection coefficient and regular reflection coefficient (the formula used for the calculation is (the diffusive reflection coefficient)=(the total reflection coefficient)−(the regular reflection coefficient)). The measured reflection coefficient of the reflective film was the value only for the reflective film.

The results for the reflective film made of white paint (white coating) are as follows.

Figure 10:
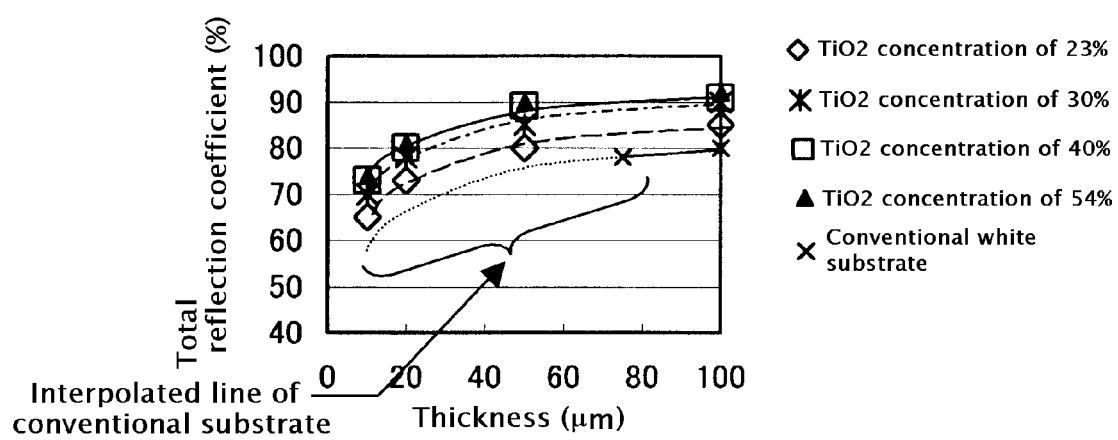
FIG. 10 is a graph illustrating the relationship between the thickness and the total reflection coefficient of a white coating which is obtained by adjusting a white pigment ($TiO_2$) concentration.

That is, first, FIG. 10 shows the relationship between the thickness and the total reflection coefficient of the white coating obtained by adjusting the white pigment ($TiO_2$) concentration. For reference purposes, the relationship between the thickness and the total reflection coefficient of the conventional white substrate is also shown. However, since no data is available for the white substrate being 75 μm or less, the reflection coefficient at 50 μm was shown by interpolation (as shown by fine dotted line).

As can be seen from FIG. 10, the white substrate used in the conventional side-view package has a total reflection coefficient of 80% at a thickness of 100 μm. On the other hand, the white coating has achieved the equivalent total reflection coefficient at a thickness of 50 μm when the white pigment concentration ($TiO_2$ concentration) is 23 wt %. The white coating, though it is thinner than the white substrate, has a total reflection coefficient equal to or greater than that of the white substrate because the $TiO_2$ concentration can be made higher and a resin that is less absorbent can be used. The white substrate can be mixed with $TiO_2$ up to its maximum concentration of 30 wt %, at which, however, moldability may deteriorate and the substrate may become brittle or difficult to process. Thus, the white substrate can be formed at an appropriate concentration of 22 wt %. This is because the resin of the white substrate has an absorption index of 10% and the white paint has an absorption index as low as 5%, and thus the white paint that is less in thickness has a higher reflection coefficient even at the same $TiO_2$ concentration. The absorption indices are different because different resin materials are used for the white substrate and the white paint.

As can be seen from the foregoing, FIG. 10 shows that the $TiO_2$ concentration of the white coating which provides the total reflection coefficient equivalent to that of the white substrate of 100 μm is in the range of 23 wt % to 54 wt %. Furthermore, since the resin of the white paint absorbs less light from the light emitting element and is therefore less deteriorated (oxidized) due to the light, the service life of its reflection coefficient characteristics is longer than that of the white substrate (at the $TiO_2$ concentration of the white coating).

Table 3 below shows the measurement results of the surface roughness, the reflection coefficient, and the rate of change in luminous flux of the white paint. Note that the thickness was kept constant at 20 μm.

TABLE 3

| Type of reflective film | Rz (μm) | Total reflection coefficient (%) | Regular reflection coefficient (%) | Diffusive reflection coefficient (%) | Rate of change in luminous flux (%) |
|---|---|---|---|---|---|
| White paint | 7 | 70% | 0.3% | 69.7% | −7.0% |
| | 3 | 70% | 2.0% | 68.0% | −4.0% |
| | 0.6 | 70% | 4.0% | 66.0% | −2.0% |
| | 7 | 74% | 0.3% | 73.7% | −5.0% |
| | 3.8 | 74% | 2.5% | 71.5% | −2.0% |
| | 0.5 | 74% | 5.0% | 69.0% | 0.0% |
| | 7 | 78% | 0.0% | 78.0% | −2.5% |
| | 3 | 78% | 2.0% | 76.0% | 1.0% |
| | 0.5 | 78% | 5.0% | 73.0% | 2.0% |
| | 7 | 81% | 0.3% | 80.7% | −1.0% |
| | 5 | 80% | 1.0% | 79.0% | 0.0% |
| | 3 | 80% | 2.0% | 78.0% | 1.5% |
| | 2 | 81% | 3.0% | 78.0% | 2.0% |
| | 0.5 | 80% | 5.0% | 75.0% | 3.0% |
| | 3 | 82% | 2.0% | 80.0% | 3.0% |
| | 1.5 | 82% | 4.0% | 78.0% | 4.0% |

TABLE 3-continued

| Type of reflective film | Rz (μm) | Total reflection coefficient (%) | Regular reflection coefficient (%) | Diffusive reflection coefficient (%) | Rate of change in luminous flux (%) |
|---|---|---|---|---|---|
| | 7 | 85% | 0.0% | 85.0% | 0.0% |
| | 10 | 85% | 0.0% | 85.0% | −1.0% |
| | 5 | 85% | 1.0% | 84.0% | 1.5% |
| | 2 | 85% | 3.0% | 82.0% | 4.5% |
| | 7 | 90% | 0.3% | 89.7% | 2.0% |
| | 3 | 90% | 2.0% | 88.0% | 3.0% |
| | 1.5 | 90% | 4.0% | 86.0% | 5.0% |
| Conventional paint | 10 | 80% | 0.0% | 80.0% | −3.0% |

First, for a white paint of resin simply mixed with a paint (being a conventional paint in the table), a reflective film thus obtained had a regular reflection coefficient of 0% and a diffusive reflection coefficient of 80%. For the regular reflection coefficient of 0%, the white paint obtained had a rate of change in luminous flux that is less by 3% than that of the conventional white substrate.

A white paint of resin mixed with a paint typically has a regular reflection coefficient of about 0 to 0.1%. At this time, a surface roughness parameter or the maximum height (i.e., surface roughness) Rz (JIS B0601:2001, see FIG. 21) is approximately 10 μm. The conventional white substrate has an Rz of approximately 1.1 μm, and the white coating of resin simply mixed with paint is found to have an Rz greater than that. It was found that the Rz can be reduced to increase the regular reflection coefficient, e.g., by increasing the thickness. However, in this case, a thickness of 100 μm or more may be desired or required. This may result in a thickness which is almost the same as that of the conventional white substrate.

In this context, the inventor of the present application controlled the surface roughness by reducing the agglomeration of white pigment ($TiO_2$). This made it possible to improve the surface accuracy and reduce the surface roughness without increasing the thickness, thereby providing a higher regular reflection coefficient. With an increased regular reflection coefficient, the resulting film was improved in luminous flux by a few % even when compared with the white substrate. It should be noted that the surface roughness of the white coating can be varied depending on not only the concentration of $TiO_2$ and the state of agglomeration of $TiO_2$ but also the irregularity of the sealing resin, the addition of a transparent resin layer in between the sealing resin and the white coating, the thickness of the white coating, and the solubility of the white pigment into a solvent or diluent.

As can be seen from the foregoing, the white paint is more suitable for a thin side-view package than the white substrate is. In particular, when the white pigment has a concentration of 23 wt % or more, it is possible to provide a side-view package reflective film being 50 μm or less in thickness (more specifically, 14 μm to 50 μm in thickness), which was not achieved with the conventional white substrate. In this instance, the aforementioned lower limit thickness or 14 μm was determined from FIG. 10 as the thickness at which the $TiO_2$ concentration is 54% and the total reflection coefficient is 78%.

The results for the reflective film made of metal are as follows. That is, for the metallic film, the surface of the sealing resin was provided with bumps and dips, so that the regular reflection coefficient and the diffusive reflection coefficient were varied without changing the total reflection coefficient. For example, bumps and dips were provided by the following methods. When using dies for molding, pre-roughened dies may be used to obtain a desired rough resin surface. When prepared by cutting them with a dicer, the diameter of diamond particles in the dicer blade may be varied. Alternatively, a scattering agent may be applied to the sealing resin and dried, and then coated with a metallic film. In the present exemplary embodiment, the roughness was adjusted using pieces of fine sandpaper of mesh grade 500 or greater. The metallic film employed for the aforementioned exemplary embodiment was made of Ag, but the metallic film may also be formed of Al, Al alloy, Ag alloy, rhodium, or rhodium alloy, which has a total reflection coefficient of 80% or more, etc.

Table 4 (below) shows the measurement results of the surface roughness, the reflection characteristics, and the rate of change in luminous flux of the metallic film.

TABLE 4

| Type of reflective film | Surface roughness Rz (μm) | Total reflection coefficient (%) | Regular reflection coefficient (%) | Diffusive reflection coefficient (%) | Rate of change in luminous flux (%) |
|---|---|---|---|---|---|
| Rhodium originally having a total reflection coefficient of 80% | 0.1 | 80% | 80% | 0% | −21.0% |
| | 0.5 | 80% | 30% | 50% | −3.0% |
| | 0.65 | 80% | 23% | 57% | 0.0% |
| | 1.5 | 80% | 18% | 62% | 1.0% |
| | 3 | 80% | 12% | 68% | 2.0% |
| | 5 | 78% | 7% | 71% | 2.5% |
| | 7 | 76% | 5% | 71% | 1.0% |
| | 10 | 73% | 2% | 71% | −1.8% |
| Al originally having a total reflection coefficient of 90% | 0.1 | 90% | 90% | 0% | −23.0% |
| | 0.65 | 90% | 24% | 66% | 0.2% |
| | 1 | 90% | 20% | 70% | 1.0% |
| | 2 | 90% | 14% | 76% | 2.5% |
| | 4 | 89% | 7% | 82% | 4.0% |
| | 8 | 87% | 5% | 82% | 3.2% |
| | 10 | 85% | 1.5% | 83.5% | 1.9% |
| | 12 | 80% | 1.0% | 79.0% | 0.0% |
| | 15 | 70% | 0.5% | 69.5% | −3.0% |
| Ag for sputtering originally having a total reflection | 0.05 | 95% | 95% | 0% | −25.0% |
| | 0.1 | 95% | 75% | 20% | −20.0% |
| | 0.3 | 95% | 50% | 45% | −10.0% |
| | 0.5 | 95% | 30% | 65% | −2.0% |
| | 0.6 | 95% | 25% | 70% | 0.5% |

TABLE 4-continued

| Type of reflective film | Surface roughness Rz (μm) | Total reflection coefficient (%) | Regular reflection coefficient (%) | Diffusive reflection coefficient (%) | Rate of change in luminous flux (%) |
|---|---|---|---|---|---|
| coefficient of 95% | 1 | 95% | 20% | 75% | 1.8% |
| | 2.5 | 95% | 10.5% | 85% | 3.5% |
| | 3 | 95% | 8% | 88% | 4.5% |
| | 5 | 93% | 6.5% | 87% | 4.8% |
| | 6 | 90% | 5% | 85% | 5.0% |
| | 8 | 88% | 3% | 85% | 4.5% |
| | 10 | 85% | 1.0% | 84.0% | 3.0% |
| | 15 | 80% | 0.5% | 79.5% | 0.0% |

As can be seen from Table 4, the metallic film has a high regular reflection coefficient but does not have a good rate of change in luminous flux. However, as the surface roughness, i.e., the maximum height Rz increases, the regular reflection coefficient decreases but the diffusive reflection component increases. At a regular reflection coefficient of 25% or less, the luminous flux is at the same level as or greater than that of the conventional white substrate. This is because an increase in the surface roughness leads to an increase in the diffusive reflection component, thereby improving the efficiency of excitation of phosphor in the sealing resin.

From the foregoing, it was found that even with the metallic film, such a side-view package that provides a comparable luminous flux to that of the conventional white substrate can be obtained at a regular reflection coefficient of 25% or less. However, since a low total reflection coefficient would cause a drop in luminous flux due to transmission and absorption, an effective total reflection coefficient is 76% or greater (which is a value at a wavelength of 560 nm). The inventor of the present application completed an exemplary embodiment of a device based on the aforementioned results of experiments and studies.

FIGS. 11A through 11C are views illustrating an exemplary configuration of a light emitting device made in accordance with principles of the disclosed subject matter. In the example of FIGS. 11A through 11C, the light emitting device is implemented as a side-view package. Note that FIG. 11A is a perspective view, FIG. 11B is a front view, and FIG. 11C is a top view. Here, in FIGS. 11B and 11C, a mount substrate 57 is not illustrated for facilitating understanding.

The light emitting device (which is a side-view package) of FIGS. 11A through 11C can includes a light emitting element 51;
a reflective frame body (e.g., white substrate) 52 disposed around the light emitting element 51 and provided with an opening on a top face and/or a bottom face and part of a side face;
an optically transparent sealing resin 53 housed in the reflective frame body (e.g., white substrate) 52 and mixed with a wavelength converting material (e.g., phosphor); and
a reflective film 54 for covering the sealing resin 53 exposed on the top face and/or the bottom face of the reflective frame body (e.g., white substrate) 52. The opening 55 on a side face of the reflective frame body (e.g., white substrate) 52 serves as a light emitting face (emission surface).

Furthermore, in the light emitting device of FIGS. 11A through 11C, part of a side face of the reflective frame body (e.g., white substrate) 52, except for the opening 55 serving as the light emitting face (emission surface), is provided with an electrode member 56. Note that in FIG. 11A, there is also shown a mount substrate 57. In FIG. 11C, there is also shown a wire 58.

A first exemplary embodiment of the presently disclosed subject matter can employ reflective film of white paint (white coating) for the reflective film 54 of the light emitting device (side-view package) of FIGS. 11A through 11C. That is, the first exemplary embodiment is configured such that the reflective film 54 of the light emitting device (side-view package) of FIGS. 11A through 11C is formed of white coating at a white pigment concentration of 23 wt % to 54 wt % in a thickness of 14 μm to 50 μm.

In this instance, the white paint contains $TiO_2$ as the white pigment, and the resin with which the white paint is prepared is made of silicone. More specifically, the coating film of white paint (i.e., white coating) can be formed in a thickness of 20 μm with a $TiO_2$ concentration of 40 wt %. In this example, the white coating is as thin as 20 μm in thickness and thus suitable for a very thin side-view package. Such a white paint of a regular reflection coefficient of 0.3% or higher and a total reflection coefficient of 80% or higher can facilitate excitation of phosphor, thereby making it possible to provide luminous flux at the same level as or greater than that of the conventional white substrate device and to maintain a desired chromaticity.

FIG. 12 shows the relationship between the surface roughness (Rz) and the rate of change in luminous flux. From the results shown in FIG. 12, it can be seen that the white coating having a total reflection coefficient of approximately 80% has a rate of change in luminous flux greater than that of the conventional white substrate when the surface roughness (Rz) is 5 μm or less. It can also be seen that the rate of change in luminous flux of the white coating is close to and at about the same level as that of the conventional white substrate at a surface roughness (Rz) of 1 μm or less even when the total reflection coefficient is as low as approximately 70%.

Figure 1:
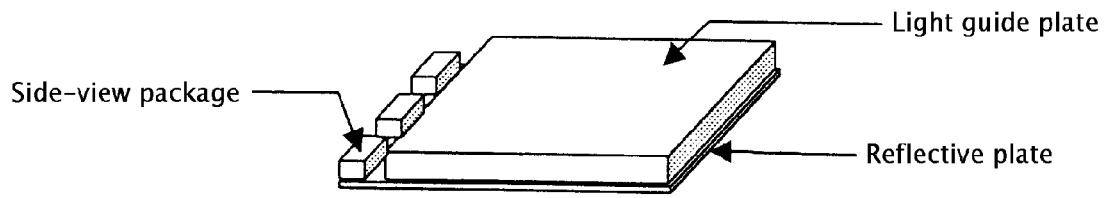
FIG. 1 is a perspective view illustrating an exemplary configuration of a conventional backlighting unit.
Figure 2:
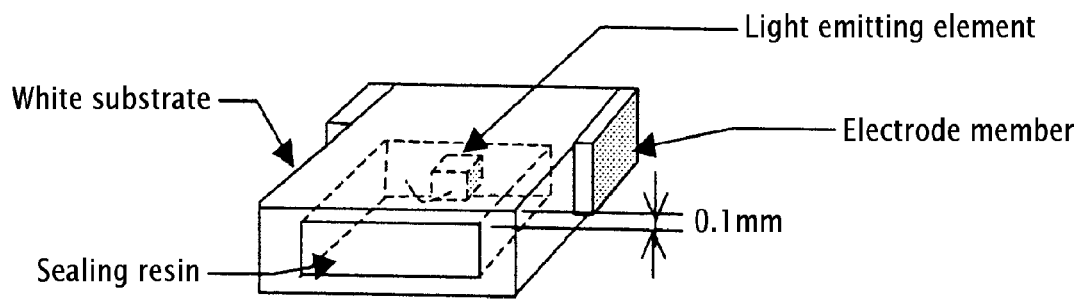
FIG. 2 is a perspective view illustrating another conventional side-view package LED.
Figure 3:
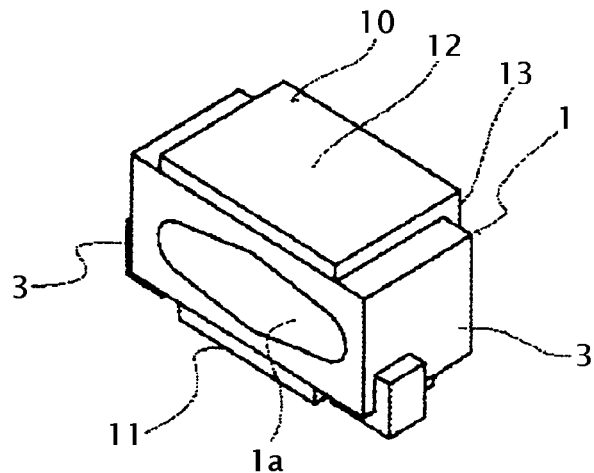
FIG. 3 is a perspective view illustrating another conventional side-view package LED.
Figure 4:
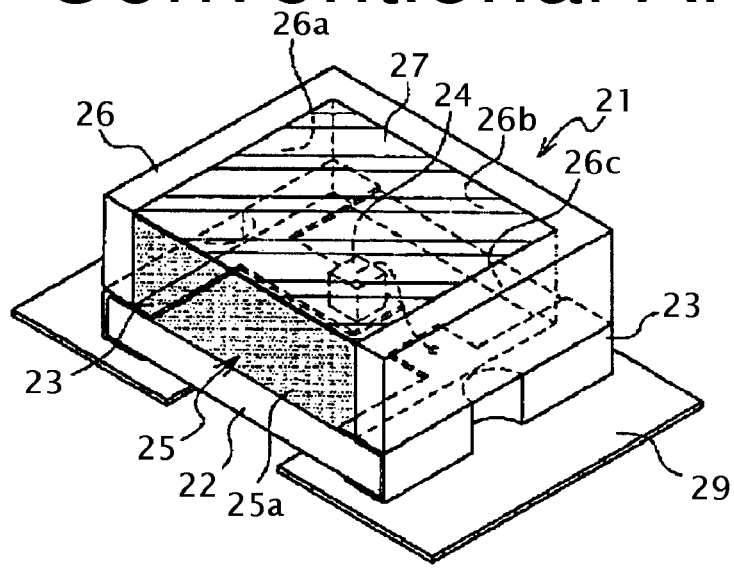
FIG. 4 is a perspective view illustrating another conventional side-view package LED.

Furthermore, in terms of a reduction in thickness, the light emitting element according to the conventional example which is placed as shown in FIG. 4 has a limit to the reduction in thickness. However, the light emitting element 51 placed as shown in FIGS. 11A through 11C can be reduced in thickness down to the thickness of the sealing resin 53. That is, in the conventional example of FIG. 4, the LED element 24 is fixedly placed on the chip substrate 22. In this case, the chip substrate 22 needs a certain extent of rigidity and thus a thickness of approximately 0.3 mm. As a result, it is difficult to maintain an entire thickness of 0.4 mm or less because the LED element 24 fixedly placed on the chip substrate 22 is limited to a height of 0.1 mm. In actual cases, the fixed LED element 24 has a height of approximately 100 μm to 200 μm, which prevents the achievement of the target height. In contrast to this, the light emitting element 51 which is fixedly placed on the substrate 52 as shown in FIGS. 11A through 11C may eliminate the chip substrate 22 of FIG. 4 or the like, thereby making it possible to reduce the entire thickness.

A second exemplary embodiment of the presently disclosed subject matter may employ a metallic film for the reflective film 54 of the light emitting device (side-view package) of FIGS. 11A through 11C.

FIG. 13 is a view (front view) illustrating a specific example of the second exemplary embodiment. This specific example is a side-view package which has a metallic film formed as the reflective film 54 in a thickness of 900 angstroms. In this instance, the metallic film is deposited on a surface 60 of the sealing resin 53 which is roughened and mixed with a wavelength converting material (e.g., phosphor) (precisely speaking, on the roughened top and bottom faces of the sealing resin 53).

In this instance, the metallic film employed can be made of Ag, an Ag alloy, or Al, etc., which totally reflects 80% or more of light in the visible region (400 nm to 800 nm). The metallic film can be deposited by vapor deposition, plasma vapor deposition, sputtering, plating, etc. In the example of FIG. 13, the metallic reflective film 54 has a thickness of 900 angstroms; however, the thickness of the metallic reflective film 54 may be 250 angstroms or greater while its total reflection coefficient can be equivalent to that of the conventional white substrate.

Furthermore, when the sealing resin 53 is roughened using a die, pre-roughened dies may be used to obtain a desired roughened resin surface. On the other hand, when the sealing resin 53 is roughened by cutting the sealing resin 53 with a dicer, the diameter of diamond particles in the dicer blade may be varied to control the roughness. Alternatively, a scattering agent may be applied to the sealing resin 53 to provide bumps and dips thereto. It is also acceptable to use pieces of fine sandpaper of mesh grade 500 or greater. Any of the methods may be used, but what is important in this particular example and particular application of the disclosed subject matter is to adjust the roughened surface so as to have a regular reflection coefficient of 25% or less. The combination of the metallic reflective film 54 and the roughened surface 60 can facilitate the excitation of phosphor which could not have been implemented using a simple metallic film. It is thus possible to provide luminous flux at the same level as or greater than that of the conventional white substrate and to maintain a desired chromaticity.

FIG. 14 is a graph illustrating the relationship between the regular reflection coefficient and the rate of change in luminous flux of the metallic film. The rate of change in luminous flux of a highly reflective metallic film which was not roughened was reduced by 25% relative to the conventional white substrate. In contrast, when the film was roughened to reduce the regular reflection coefficient, the resulting film was improved in brightness when compared with the conventional one. For example, the film deposited by Ag sputtering was bright when the regular reflection coefficient was within the range of 0.5% to 25%. The other metallic films provided the same or similar results.

FIG. 15 is a graph showing the surface roughness and the rate of change in luminous flux of the metallic film, which are created from the surface roughness (Rz) and the rate of change in luminous flux of Table 4. From the data of the metallic film (Ag) having a total reflection coefficient of 95% in the graph of FIG. 15, it was found that the film provides luminous flux at the same level as or greater than that of the conventional white substrate when the surface roughness (Rz) is within the range of 0.6 µm to 15 µm. The other metallic films provided the same or similar results.

Note that the side-view package of FIG. 13 with the reflective film 54 formed of metal would probably cause faulty electrical continuity when used with a mount substrate having a light guide plate. For example, when mounted onto the mount substrate, the side-view package is brought into contact with the mount substrate. Accordingly, if there is any wiring, this would possibly cause a problem such as leakage. Furthermore, when the electrode of the side-view package is fixed by soldering to the wiring of the mount substrate, the solder may slightly spread out to reach the metallic film. In this case, the side-view package may suffer from its own leakage.

To address this problem, as shown in FIG. 16, an insulator film 62 can be provided on the metallic film 54 or over the entire metallic film 54, thereby preventing faulty electrical continuity.

The insulator film 62 can be formed of any material so long as it is not conducting. For example, regardless of its color, the material employed may be a paint, adhesive, or hard coating; and any color such as transparent, white, silver, or black may be employed. On the other hand, any resin may be used as the paint and adhesive so long as it can be adhered to the metallic film, including any one of the epoxy-based, acryl-based, urethane-based, silicone-based resins. Alternatively, the insulator film 62 may also be formed of ceramic-based insulator film. For example, metal nitride films such as AlN and $Si_3N_4$ or metal oxide films such as $SiO_2$, $TiO_2$, $Ta_2O_5$, and ZnO may also be employed. The film can be deposited by sputtering, vapor deposition, or by plating, etc. Alternatively, the insulator film 62 may also be formed of a coating agent which is a mixture of ceramic and resin such as a photocatalyst solution.

In the exemplary configuration of FIGS. 11A through 11C, the reflective frame body (e.g., white substrate) 52 was cut away to form a reflective film. However, as shown in each of the following examples, various modified examples may be allowed, including embodiments in which the reflective frame body (e.g., white substrate) is eliminated.

FIG. 17 is a view illustrating a modified example in which the reflective film 54 is provided on the top face, the bottom face, the right side face, and the left side face of the sealing resin 53 mixed with a wavelength converting material (e.g., phosphor). In this case, the frame body of white substrate is not provided on the top, bottom, right, and left sides.

FIG. 18 is a view illustrating an exemplary configuration employed when light from a light emitting element is emitted in a direction of a side face of the sealing resin 53 to be spread out. In the example of FIG. 18, the reflective film 54 is provided only on the top face and the bottom face of the sealing resin 53 and neither frame body of white substrate nor reflective film is provided on the right and left side faces. This configuration can allow light to be spread as much as possible in the light emitting direction or the horizontal direction (i.e., to provide as wide a directivity as possible).

FIG. 19 is a view illustrating an exemplary configuration employed when light is desired to be spread out in all directions from the sealing resin 53 and as wide as possible. In the example of FIG. 19, the reflective film 54 is provided only on part of the top face and part of the bottom face of the sealing resin 53 to spread emission in all directions (i.e., to provide a wider directivity).

Note that in FIGS. 18 and 19, the electrode member 56 is not illustrated for facilitating understanding.

Furthermore, in each of the aforementioned examples, the reflective film 54 was formed not only on the top face of the sealing resin 53 but also on the bottom face, however, the reflective film on the bottom face (near the mount substrate) of the sealing resin 53 can be eliminated. FIGS. 20A and 20B are views illustrating an exemplary configuration in which the reflective film facing the mount substrate is eliminated (FIG. 20A is a front view, and FIG. 20B is a side view). However, in this case, the color of the mount substrate 57 facing the bottom face of the sealing resin 53 is preferably white so as not to unnecessarily reduce luminous flux.

As described above, the light emitting device according to the first exemplary embodiment can include: a light emitting element;

an optically transparent sealing resin having a shape including a pair of faces opposed to each other with an axis of light emitting direction of the light emitting device interposed therebetween, the sealing resin being disposed to cover the light emitting element and mixed with a wavelength converting material; and a reflective film provided on at least one of the pair of opposed faces of the sealing resin. In this device, the reflective film is a white coating containing a white pigment in a concentration of 23 wt % to 54 wt % and formed to be 14 μm to 50 μm in thickness.

Thus, although the light emitting device is configured to prevent leakage of light, it can be reduced in thickness as compared with conventional devices, and can effectively prevent such degradation in luminous flux (luminous flux drop) as apparent in the cases described in Japanese Patent Application Laid-Open No. 2005-223082.

Furthermore, the light emitting device according to the second exemplary embodiment includes a light emitting element;

an optically transparent sealing resin having a shape including a pair of faces opposed to each other with an axis of light emitting direction of the light emitting device interposed therebetween, the sealing resin being disposed to cover the light emitting element and mixed with a wavelength converting material; and a reflective film provided on at least one of the pair of opposed faces of the sealing resin, with e reflective film being at least one metallic film and 0.6 μm to 15 μm in maximum height Rz.

In other words, the light emitting device according to the second exemplary embodiment can include a light emitting element;

an optically transparent sealing resin having a shape including a pair of faces opposed to each other with an axis of light emitting direction of the light emitting device interposed therebetween, the sealing resin being disposed to cover the light emitting element and mixed with a wavelength converting material; and a reflective film provided on at least one of the pair of opposed faces of the sealing resin. The reflective film can include at least one metallic film. Furthermore, the surface of the sealing resin covered with the reflective film can be roughened to have a regular reflection coefficient of 0.5% to 25%.

Thus, although the light emitting device is configured to prevent leakage of light, it can be reduced in thickness as compared with conventional devices, and can effectively prevent such degradation in luminous flux (luminous flux drop) as is apparent in the cases described in Japanese Patent Application Laid-Open No. 2005-223082.

Furthermore, in the light emitting device according to the second exemplary embodiment described above, an insulator film can be formed to cover the metallic film. In this case, the insulator film can prevent faulty electrical continuity.

Furthermore, the light emitting device according to the exemplary embodiments described above may be provided with an electrode member. In this case, the electrode member can be provided, except for the opening serving as the light emitting face, on part of a side face of the sealing resin or part of a side face of a reflective frame body when the light emitting device has a reflective frame body which houses the sealing resin therein.

As such, when the electrode member is provided at portions except for the opening serving as the light emitting face, it is possible to provide a further reduction in thickness.

The light emitting device according to the above described exemplary embodiments are specifically of a side-view type which mainly emit light from its side face (i.e., which has a main light emitting direction in parallel to a mount substrate of the light emitting device). In this instance, the pair of faces can be substantially parallel to the mount substrate.

Furthermore, in each of the aforementioned examples, the wavelength converting material (e.g., phosphor) added to the sealing resin may be a yellow-based wavelength converting material that works in conjunction with a light emitting element that emits blue light. However, the configuration of devices made in accordance with principles of the disclosed subject matter also has a good effect on excitation of phosphor even for green-based or red-based phosphor. On the other hand, when the light emitting element emits light in the ultraviolet region, the phosphor to be employed may be conceivably blue, green, yellow, red, or deep red, or a combination of one or more of these phosphors. However, even in these cases, the reflective film can have a good effect on excitation of phosphor.

As described above, the presently disclosed subject matter includes devices that employ a white coating having a certain total reflection coefficient (78% or higher) and regular reflection coefficient (0.3% or higher); a white coating 5 μm or less in its maximum height (surface roughness) Rz to increase the regular reflection coefficient; or a metallic film deposited on a roughened surface. This can provides the following effect or combination of effects:

1) A reflective component of 50 μm or less in thickness can be provided which could not be realized with a conventional white substrate device;

2) Phosphor can be effectively excited, thereby making it possible to obtain luminous flux at the same level as or higher than that of the conventional light emitting device that include a white substrate; and 3) Less absorption of light by the white paint allows for preventing degradation in reflection coefficient characteristics.

In addition, devices of the presently disclosed subject matter are applicable for use as a compact backlight for use in cellular phones, PDAs, compact monitors, DSCs (digital still cameras), DVCs (digital video cameras), portable music players, PCs, TVs and the like.

What is claimed is:

1. A light emitting device comprising:
   a light emitting element configured to emit light along a light emitting axis;
   an optically transparent sealing resin having a shape including a pair of faces opposed to each other with the light emitting axis of the light emitting device interposed between the pair of faces, the sealing resin located adjacent the light emitting element and including a wavelength converting material; and
   a reflective film located adjacent at least one of the pair of opposed faces of the sealing resin, wherein
   the reflective film is at least one of,
      a white coating containing a transparent resin and a white pigment in a concentration of 23 wt % to 54 wt % and having a thickness from substantially 14 μm to substantially 50 μm, the white coating having a roughness of 5 μm or less by reducing the agglomeration of the white pigment, and at least one metallic film having a thickness of from 250 angstroms to 900 angstroms and having a maximum height Rz from 0.6 μm to 15 μm, the metallic film having a total reflection coefficient of 76% or more and made of a metal having a total reflection coefficient of 80% or more, the metallic film directly covering an adjacent surface of the sealing resin, the sealing resin being roughened so that the metallic film has a regular reflection coefficient of 0.5% to 25%.

2. The light emitting device according to claim 1, further comprising an insulator film located adjacent and substantially covering the metallic film.

3. The light emitting device according to claim 2, further comprising an electrode member provided on at least a portion of a side face of the sealing resin except for an opening portion of the sealing resin which serves as a light emitting face.

4. The light emitting device according to claim 2, further comprising:
a reflective frame body which houses the sealing resin; and
an electrode member located on at least a portion of a side face of the reflective frame body except for an opening which serves as a light emitting face.

5. The light emitting device according to claim 2, wherein:
the light emitting device is a side-view type light emitting device in which the light emitting axis is substantially parallel with a mount substrate of the light emitting device; and
the pair of faces are substantially parallel to the mount substrate.

6. The light emitting device according to claim 1, further comprising an electrode member provided on at least a portion of a side face of the sealing resin except for an opening portion of the sealing resin which serves as a light emitting face.

7. The light emitting device according to claim 6, wherein:
the light emitting device is a side-view type light emitting device in which the light emitting axis is substantially parallel with a mount substrate of the light emitting device; and
the pair of faces are substantially parallel to the mount substrate.

8. The light emitting device according to claim 1, further comprising:
a reflective frame body which houses the sealing resin; and
an electrode member located on at least a portion of a side face of the reflective frame body except for an opening which serves as a light emitting face.

9. The light emitting device according to claim 1, wherein:
the light emitting device is a side-view type light emitting device in which the light emitting axis is substantially parallel with a mount substrate of the light emitting device; and
the pair of faces are substantially parallel to the mount substrate.

10. The light emitting device according to claim 1, wherein the reflective film is located on the sealing resin.

11. The light emitting device according to claim 1, wherein the reflective film is a white coating containing a transparent resin and a white pigment in a concentration of 23 wt % to 54 wt % and having a thickness from substantially 14 μm to substantially 50 μm, the white coating having a surface roughness of 5 μm or less by reducing the agglomeration of the white pigment.

12. The light emitting device according to claim 1, wherein the reflective film is at least one metallic film having a thickness of from 250 angstroms to 900 angstroms and having a maximum height Rz from 0.6 μm to 15 μm, the metallic film having a total reflection coefficient of 76% or more and made of a metal having a total reflection coefficient of 80% or more, the metallic film directly covering an adjacent surface of the sealing resin, the sealing resin being roughened so that the metallic film has a regular reflection coefficient of 0.5% to 25%.

13. The light emitting device according to claim 1, wherein the reflective film is located on a top face, a bottom face, a right side face, and a left side face of the sealing resin.

14. The light emitting device according to claim 1, wherein the metallic film is formed of one selected from the group consisting of Al, Al alloy, Ag, Ag alloy, rhodium, and rhodium alloy.

15. The light emitting device according to claim 1, further comprising an insulator film provided over the entire metallic film opposite to the sealing resin.

16. The light emitting device according to claim 1, wherein the white pigment is $TiO_2$ and the transparent resin includes at least one selected from the group consisting of silicone-based, acryl-based, urethane-based, and epoxy-based resins.

17. The light emitting device according to claim 16, wherein the surface of the white coating being in direct contact with the sealing resin has a surface roughness Rz of 1 μm or less.

18. The light emitting device according to claim 16, further comprising an electrode member provided on at least a portion of a side face of the sealing resin except for an opening portion of the sealing resin which serves as a light emitting face.

19. The light emitting device according to claim 16, further comprising:
a reflective frame body which houses the sealing resin; and
an electrode member located on at least a portion of a side face of the reflective frame body except for an opening which serves as a light emitting face.

20. The light emitting device according to claim 16, wherein the light emitting device is a side-view type light emitting device having a light emitting axis that is substantially parallel with a mount substrate of the light emitting device; and
the pair of faces of the sealing resin are substantially parallel to the mount substrate.

* * * * *